(12) United States Patent
Han

(10) Patent No.: US 11,044,825 B1
(45) Date of Patent: Jun. 22, 2021

(54) FOLDABLE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Wen Han, Wuhan (CN)

(*) Notice: Subject to any disclaimer, the term of this patent is extended or adjusted under 35 U.S.C. 154(b) by 0 days.

(21) Appl. No.: 16/637,765

(22) PCT Filed: Jan. 2, 2020

(86) PCT No.: PCT/CN2020/070063
§ 371 (c)(1),
(2) Date: Feb. 10, 2020

(30) Foreign Application Priority Data

Dec. 18, 2019 (CN) .......................... 201911309799.1

(51) Int. Cl.
*H05K 5/02* (2006.01)
*H05K 5/00* (2006.01)
*G06F 1/16* (2006.01)
*F16H 19/04* (2006.01)

(52) U.S. Cl.
CPC ........... *H05K 5/0226* (2013.01); *F16H 19/04* (2013.01); *G06F 1/1681* (2013.01); *H05K 5/0017* (2013.01); *G06F 1/1616* (2013.01)

(58) Field of Classification Search
CPC .... H05K 5/0226; H05K 5/0017; F16H 19/04; G06F 1/1681; G06F 1/1616
See application file for complete search history.

(56) References Cited

U.S. PATENT DOCUMENTS

| | | | |
|---|---|---|---|
| 9,204,565 B1* | 12/2015 | Lee | E05D 3/022 |
| 9,348,450 B1* | 5/2016 | Kim | G06F 1/1681 |
| 9,535,452 B2* | 1/2017 | Ahn | H05K 5/0017 |
| 9,600,035 B2* | 3/2017 | Park | G06F 1/1652 |
| 9,778,682 B2* | 10/2017 | Lee | G06F 1/1641 |
| 10,028,395 B2* | 7/2018 | Chen | H05K 5/0217 |
| 10,215,332 B2* | 2/2019 | Lee | G06F 1/1616 |
| 10,564,682 B1* | 2/2020 | Wu | F16C 11/04 |
| 10,571,962 B2* | 2/2020 | Araki | H04M 1/0268 |
| 10,716,228 B2* | 7/2020 | You | H05K 5/0086 |
| 10,831,243 B2* | 11/2020 | Kim | G06F 1/1641 |
| 2012/0044620 A1* | 2/2012 | Song | G06F 1/1681 |
| | | | 361/679.01 |
| 2012/0307423 A1* | 12/2012 | Bohn | G06F 1/1652 |
| | | | 361/679.01 |

(Continued)

*Primary Examiner* — Abhishek M Rathod

(57) ABSTRACT

A foldable display device comprises a flexible display panel, a first bottom shell, a second bottom shell, a lifting mechanism, and a transmission mechanism. The flexible display panel comprises a first display area, a second display area, and a foldable display area between the first display area and the second display area. The first bottom shell, the second bottom shell, and the transmission mechanism are respectively disposed below the first display area, the second display area, and the foldable display area. The transmission mechanism is rotatably connected to the lifting mechanism and is configured to make a support member of the lifting mechanism to provide support for the foldable display area when the foldable display device is in an unfolded state. This prevents the foldable display area from collapsing due to finger pressing, or wrinkling and peeling due to bending.

17 Claims, 8 Drawing Sheets

(56) References Cited

U.S. PATENT DOCUMENTS

| | | | | |
|---|---|---|---|---|
| 2013/0021762 | A1* | 1/2013 | van Dijk | G09F 9/301 |
| | | | | 361/749 |
| 2014/0042293 | A1* | 2/2014 | Mok | G06F 1/1652 |
| | | | | 248/682 |
| 2015/0233162 | A1* | 8/2015 | Lee | G06F 1/1626 |
| | | | | 16/223 |
| 2015/0330614 | A1* | 11/2015 | Lee | G09F 9/301 |
| | | | | 362/97.1 |
| 2015/0366089 | A1* | 12/2015 | Park | G06F 1/1641 |
| | | | | 361/679.01 |
| 2016/0007441 | A1* | 1/2016 | Matsueda | H01L 51/0097 |
| | | | | 361/749 |
| 2016/0091923 | A1* | 3/2016 | Morrison | G06F 1/1652 |
| | | | | 345/55 |
| 2016/0132074 | A1* | 5/2016 | Kim | G06F 1/1652 |
| | | | | 715/769 |
| 2018/0335679 | A1* | 11/2018 | Hashimoto | G02F 1/13338 |
| 2020/0103935 | A1* | 4/2020 | Hsu | G06F 1/1681 |
| 2020/0201400 | A1* | 6/2020 | Jan | G06F 1/1652 |

\* cited by examiner

FOLDABLE DISPLAY DEVICE

FIELD OF INVENTION

The present disclosure relates to the technical field of display devices, and particularly to a foldable display device.

BACKGROUND

Flexible display panels, such as organic light emitting diode display panels, are used to implement foldable display devices due to their flexibility.

However, when a current foldable display device is in an unfolded state, a foldable display area in a center of its flexible display panel is not supported. Therefore, when a finger presses the foldable display area for touch control, the foldable display area is prone to collapse. Furthermore, the foldable display area is also prone to wrinkle after being bent several times, thereby causing peeling. Therefore, it is necessary to provide a foldable display device to solve the problems existing in the prior art.

SUMMARY OF DISCLOSURE

In order to solve the technical problems that the foldable display area of the current foldable display device is prone to collapse due to finger pressing or wrinkle and peeling due to bending, the present disclosure provides a foldable display device. The foldable display device comprises a flexible display panel, a first bottom shell, a second bottom shell, a lifting mechanism, and a transmission mechanism. The flexible display panel comprises a first display area, a second display area, and a foldable display area between the first display area and the second display area. The first bottom shell is disposed below the first display area. The second bottom shell is disposed below the second display area. The lifting mechanism comprises a support member, a first support rod, a second support rod, a third support rod, and a fourth support rod. The support member is disposed below the foldable display area. Top ends of the first support rod and the third support rod are rotatably connected to a first side of the support member. Top ends of the second support rod and the fourth support rod are rotatably connected to a second side of the support member. The second side is opposite to the first side. The first support rod intersects the second support rod, and the third support rod intersects the fourth support rod. The transmission mechanism is connected to bottom ends of the first support rod, the second support rod, the third support rod, and the fourth support rod, the first bottom shell, and the second bottom shell. The transmission mechanism is configured to apply a moment to the first support rod, the second support rod, the third support rod, and the fourth support rod during a unfolding process of the foldable display device so that the support member provides support for the foldable display area when the foldable display device is in an unfolded state.

In a first embodiment, the support member is a rigid plate. During the process of unfolding the foldable display device, the transmission mechanism makes the bottom end of the first support rod close to the bottom end of the second support rod and makes the bottom end of the third support rod close to the bottom end of the fourth support rod. Therefore, the support member is raised in parallel with respect to the first bottom shell and the second bottom shell to a position providing support for the foldable display area.

In the first embodiment, the transmission mechanism comprises a first bottom rod, a second bottom rod, a first rack, a second rack, a third rack, a fourth rack, a first gear, a second gear, a third gear, and a fourth gear. Both ends of the first bottom rod are respectively connected to the bottom end of the first support rod and the bottom end of the third support rod. Both ends of the second bottom rod are respectively connected to the bottom end of the second support rod and the bottom end of the fourth support rod. The second bottom rod is parallel to the first bottom rod. The first rack is connected to one end of the first bottom rod. The second rack is connected to the other end of the first bottom rod. The third rack is connected to one end of the second bottom rod. The fourth rack is connected to the other end of the second bottom rod. The first gear is connected to an end of a side of the second bottom shell facing the first bottom shell. The first gear is disposed on and meshes with the first rack. The second gear is connected to the other end of a side of the second bottom shell facing the first bottom shell. The second gear is disposed on and meshes with the second rack. The third gear is connected to an end of a side of the first bottom shell facing the second bottom shell. The third gear is disposed on the third rack and meshes with the third rack and the first gear. The fourth gear is connected to the other end of a side of the second bottom shell facing the first bottom shell. The fourth gear is disposed on the fourth rack and meshes with the fourth rack and the second gear.

In the first embodiment, during the unfolding process of the foldable display device, the first gear and the third gear rotate synchronously to bring the first rack and the third rack approach each other, and the second gear and the fourth gear rotate synchronously to bring the second rack and the fourth rack approach each other. Therefore, the first bottom rod and the second bottom rod approach each other, the bottom end of the first support rod and the bottom end of the second support rod approach each other, the bottom end of the third support rod and the bottom of the fourth support rod approach each other, and the support member is raised in parallel with respect to the first bottom shell and the second bottom shell to a position providing support for the foldable display area.

In the first embodiment, the foldable display device further comprises a gear cover. The gear cover comprises a cover plate, two side plates, and two sliding grooves. The cover plate covers the lifting mechanism. The two side plates are respectively disposed on two opposite sides of the cover plate. The first gear and the third gear are rotatably connected to one side plate. The second gear and the fourth gear are rotatably connected to the other side plate. The two sliding grooves are respectively disposed on the cover plate near the two side plates. One of sliding grooves is configured for the first rack and the third rack to slide therein, and the other sliding groove is configured for the second rack and the fourth rack to slide therein.

In the first embodiment, the foldable display device further comprises a first middle frame and a second middle frame. The first middle frame is disposed between the first bottom shell and the first display area. The first middle frame is configured to support the first display area when the foldable display device is in the unfolded state. The second middle frame is disposed between the second bottom shell and the second display area. The second middle frame is configured to support the second display area when the foldable display device is in the unfolded state.

In the first embodiment, the foldable display device further comprises a first front frame and a second front frame. The first front frame is disposed on the first display area and surrounding the first bottom shell. The second front frame disposed on the second display area and surrounding the second bottom shell.

In a second embodiment, an intersection of the first support rod and the second support rod is provided with a hinge, and an intersection of the third support rod and the fourth support rod is provided with another hinge. The support member is a rigid plate provided with four chutes. The top ends of the first support rod, the second support rod, the third support rod, and the fourth support rod are rotatably connected to the support member via the four chutes, respectively. During the unfolding process of the foldable display device, the transmission mechanism makes the top ends of the first support rod and the second support rod approach each other through the chutes and makes the top ends of the third support rod and the fourth support rod approach each other through the chutes. Therefore, the support member is raised in parallel with respect to the first bottom shell and the second bottom shell to a position providing support for the foldable display area.

In the second embodiment, a ratio of a distance from the top end of the first support rod to the adjacent hinge to a distance from the bottom end of the first support rod to the same hinge, a ratio of a distance from the top end of the second support rod to the adjacent hinge to a distance from the bottom end of the second support rod to the same hinge, a ratio of a distance from the top end of the third support rod to the adjacent hinge to a distance from the bottom end of the third support rod to the same hinge, and a ratio of a distance from the top end of the fourth support rod to the adjacent hinge to a distance from the bottom end of the fourth support rod to the same hinge are greater than 0 and less than or equal to 1.

In the second embodiment, the transmission mechanism comprises a first bottom rod, a second bottom rod, a first rack, a second rack, a third rack, a fourth rack, a first gear, a second gear, a third gear, and a fourth gear. Both ends of the first bottom rod are respectively connected to the bottom end of the first support rod and the bottom end of the third support rod. Both ends of the second bottom rod are respectively connected to the bottom end of the second support rod and the bottom end of the fourth support rod. The second bottom rod is parallel to the first bottom rod. The first rack is connected to one end of the first bottom rod. The second rack is connected to the other end of the first bottom rod. The third rack is connected to one end of the second bottom rod. The fourth rack is connected to the other end of the second bottom rod. The first gear is connected to an end of a side of the second bottom shell facing the first bottom shell. The first gear is disposed on and meshes with the first rack. The second gear is connected to the other end of a side of the second bottom shell facing the first bottom shell. The second gear is disposed on and meshes with the second rack. The third gear is connected to an end of a side of the first bottom shell facing the second bottom shell. The third gear is disposed on the third rack and meshes with the third rack and the first gear. The fourth gear is connected to the other end of a side of the second bottom shell facing the first bottom shell. The fourth gear is disposed on the fourth rack and meshes with the fourth rack and the second gear.

In the second embodiment, during the unfolding process of the foldable display device, the first gear and the third gear rotate synchronously to bring the first rack and the third rack approach each other, and the second gear and the fourth gear rotate synchronously to bring the second rack and the fourth rack approach each other. Therefore, the first bottom rod and the second bottom rod approach each other, the bottom end of the first support rod and the bottom end of the second support rod approach each other, the bottom end of the third support rod and the bottom end of the fourth support rod approach each other, and the support member is raised in parallel with respect to the first bottom shell and the second bottom shell to a position providing support for the foldable display area.

In a third embodiment, an intersection of the first support rod and the second support rod is provided with a hinge, and an intersection of the third support rod and the fourth support rod is provided with another hinge. The support member is a flexible plate. During the unfolding process of the foldable display device, the transmission mechanism makes the top end of the first support rod away from the top end of the second support rod and makes the top end of the third support rod away from the top end of the fourth support rod. Therefore, the support member is unfolded to provide support for the foldable display area.

In the third embodiment, a ratio of a distance from the top end of the first support rod to the adjacent hinge to a distance from the bottom end of the first support rod to the same hinge, a ratio of a distance from the top end of the second support rod to the adjacent hinge to a distance from the bottom end of the second support rod to the same hinge, a ratio of a distance from the top end of the third support rod to the adjacent hinge to a distance from the bottom end of the third support rod to the same hinge, and a ratio of a distance from the top end of the fourth support rod to the adjacent hinge to a distance from the bottom end of the fourth support rod to the same hinge are greater than 0 and less than or equal to 1.

In the third embodiment, the transmission mechanism comprises a first bottom rod, a second bottom rod, a first rack, a second rack, a third rack, a fourth rack, a first gear, a second gear, a third gear, and a fourth gear. Both ends of the first bottom rod are respectively connected to the bottom end of the first support rod and the bottom end of the third support rod. Both ends of the second bottom rod are respectively connected to the bottom end of the second support rod and the bottom end of the fourth support rod. The second bottom rod is parallel to the first bottom rod. The first rack is connected to one end of the first bottom rod. The second rack is connected to the other end of the first bottom rod. The third rack is connected to one end of the second bottom rod. The fourth rack is connected to the other end of the second bottom rod. The first gear is connected to an end of a side of the second bottom shell facing the first bottom shell. The first gear is disposed below and meshes with the first rack. The second gear is connected to the other end of a side of the second bottom shell facing the first bottom shell. The second gear is disposed below and meshes with the second rack. The third gear is connected to an end of a side of the first bottom shell facing the second bottom shell. The third gear is disposed below the third rack and meshes with the third rack and the first gear. The fourth gear is connected to the other end of a side of the second bottom shell facing the first bottom shell. The fourth gear is disposed below the fourth rack and meshes with the fourth rack and the second gear.

In the third embodiment, during the unfolding process of the foldable display device, the first gear and the third gear rotate synchronously to bring the first rack and the third rack away from each other, and the second gear and the fourth gear rotate synchronously to bring the second rack and the fourth rack away from each other. Therefore, the first bottom rod and the second bottom rod each other, the bottom end of the first support rod and the bottom end of the second support rod away from each other, the bottom end of the third support rod and the bottom of the fourth support rod away from each other, and the support member is unfolded to provide support for the foldable display area.

In the third embodiment, when the foldable display device is in a folded state, the flexible plate is bent and accommodated in a space defined by the first support rod, the second support rod, the third support rod, and the fourth support rod from their top ends to their adjacent intersections. When the foldable display device is in an unfolded state, the flexible plate is in an unfolded state.

In the third embodiment, the flexible plate is made of a flexible material or a plurality of rigid strips connected together by a rotating shaft.

When a foldable display device of the present invention is in an unfolded state, a support member of a lifting mechanism provides support for a foldable display area by a transmission mechanism. This prevents the foldable display area from collapsing due to finger pressing, or wrinkling and peeling due to bending.

DETAILED DESCRIPTION

Figure 1:
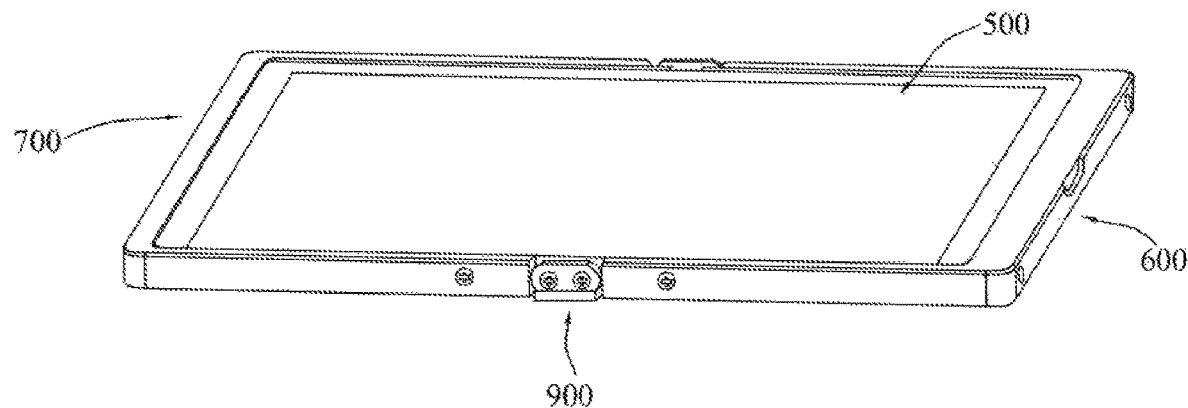
FIG. 1 is a schematic diagram of a foldable display device according to a first embodiment of the present invention in an unfolded state.
Figure 2:
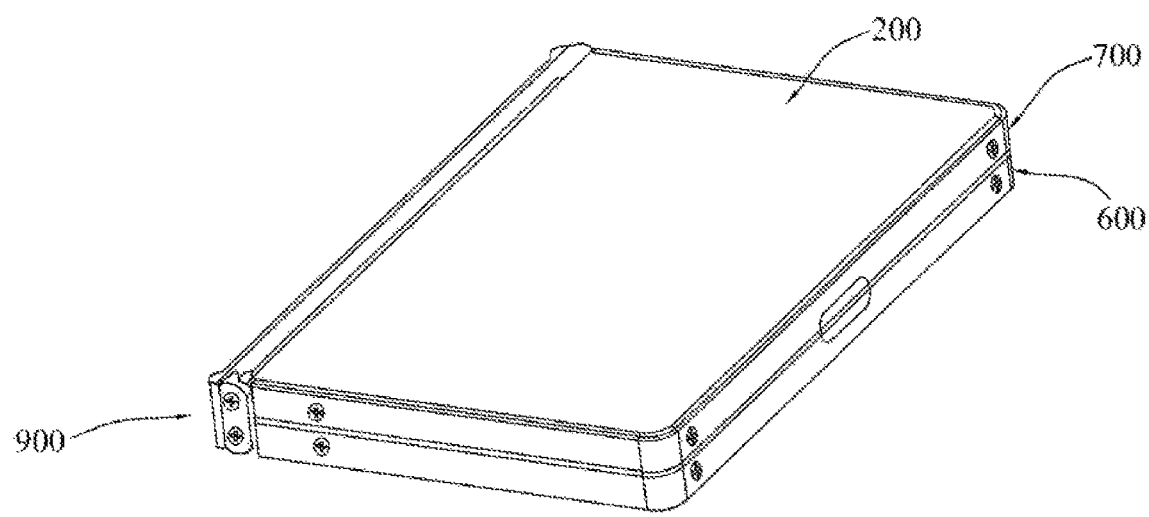
FIG. 2 is a schematic diagram of the foldable display device according to the first embodiment of the present invention in a folded state.
Figure 3:
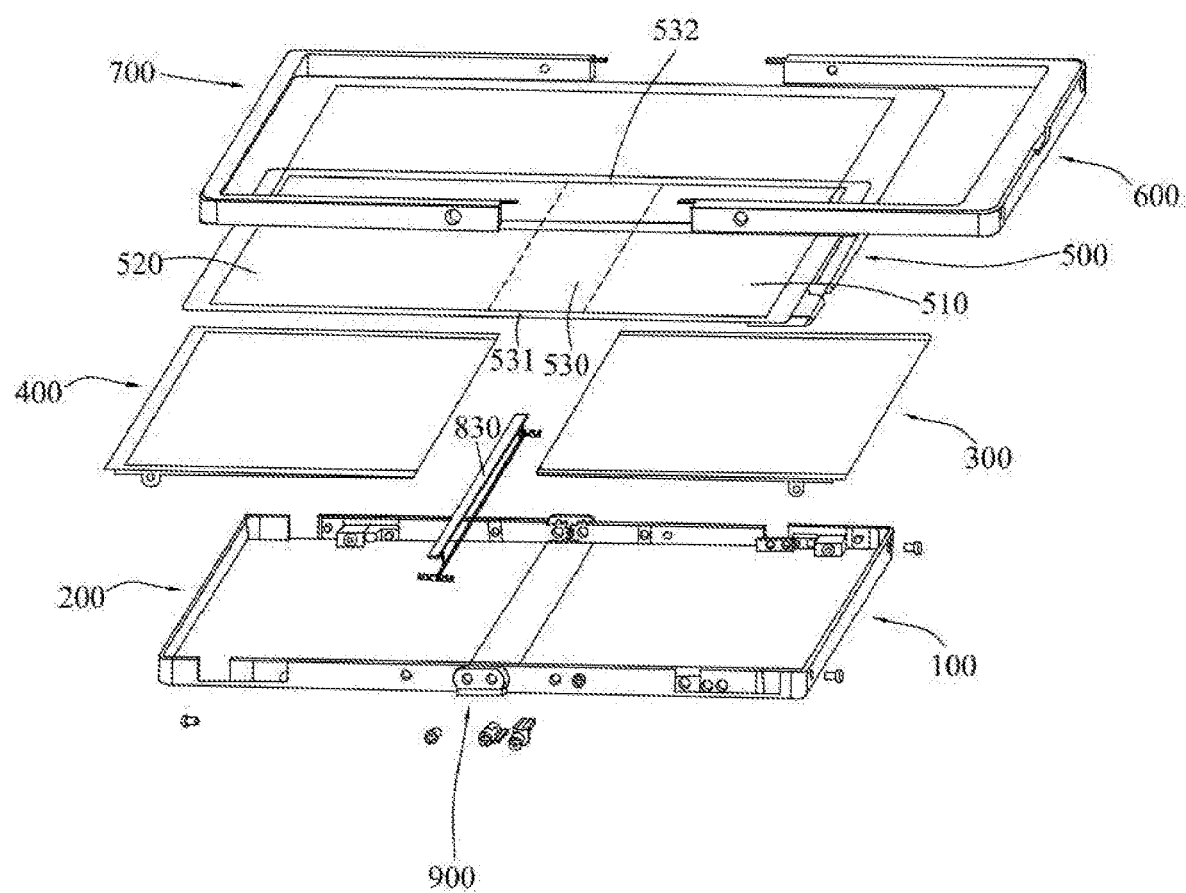
FIG. 3 is an exploded view of the foldable display device according to the first embodiment of the present invention in the unfolded state, in which sliding grooves are omitted.
Figure 4:
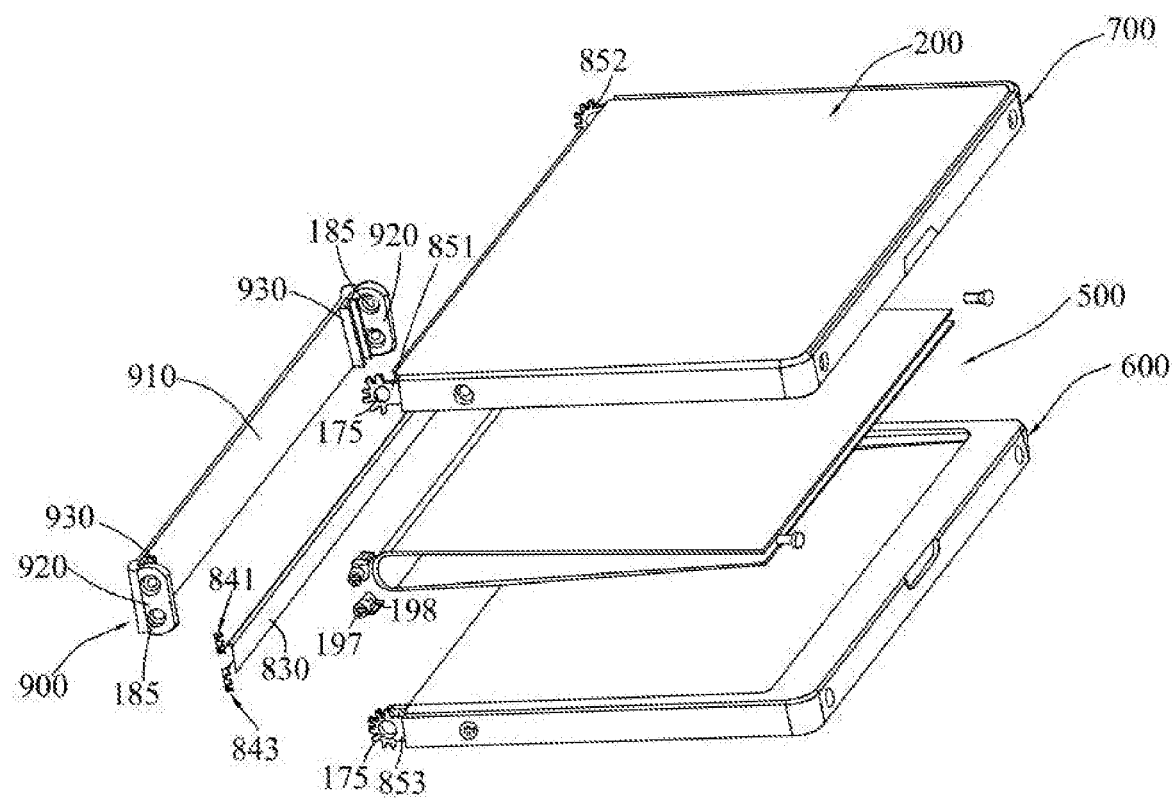
FIG. 4 is a partially exploded view of the foldable display device according to the first embodiment of the present invention in the folded state.
Figure 5:
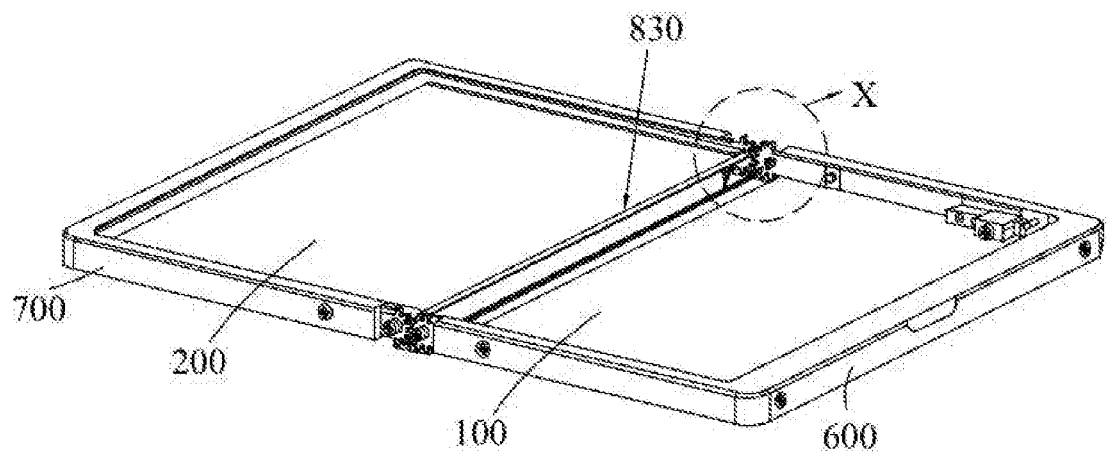
FIG. 5 is a schematic diagram showing a combination of a first bottom shell, a second bottom shell, a first front frame, a second front frame, a lifting mechanism, and a transmission mechanism according to the first embodiment of the present invention.
Figure 6:
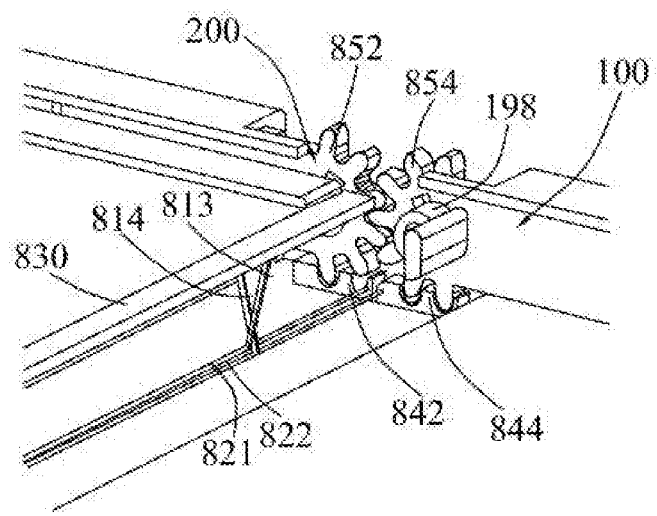
FIG. 6 is a partially enlarged view of an X region in FIG. 5.
Figure 7:
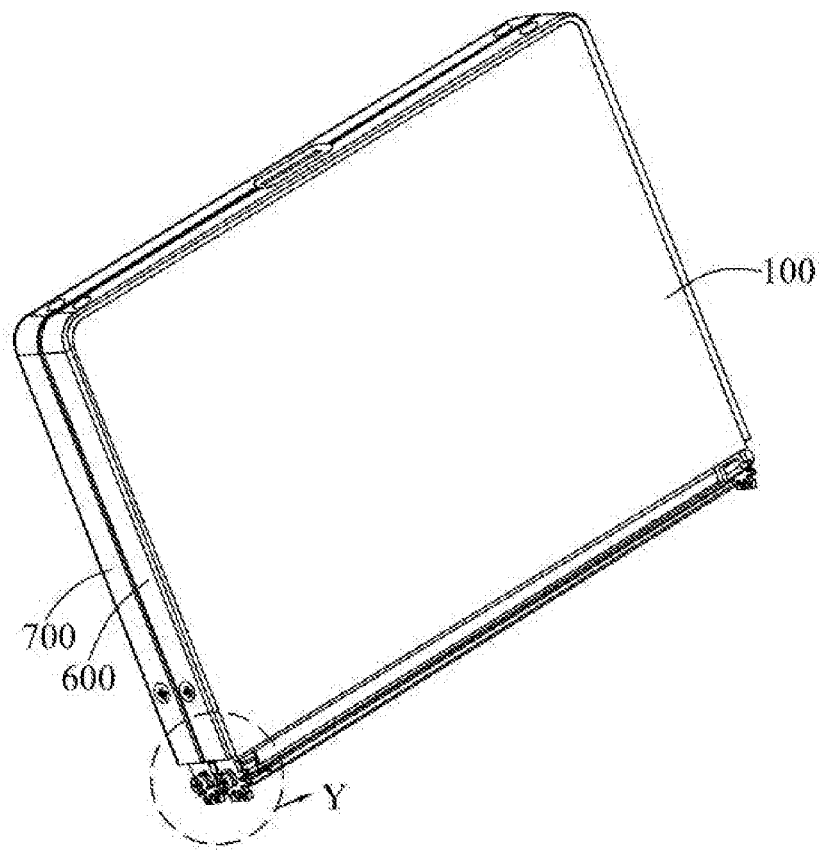
FIG. 7 is a schematic diagram of the foldable display device according to the first embodiment of the present invention in the folded state, in which a gear cover is omitted.
Figure 8:
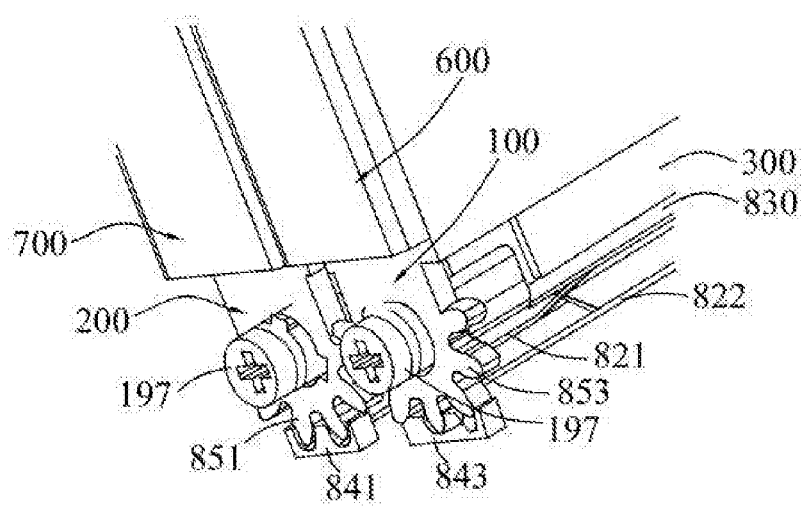
FIG. 8 is a partially enlarged view of a Y region in FIG. 7.
Figure 9:
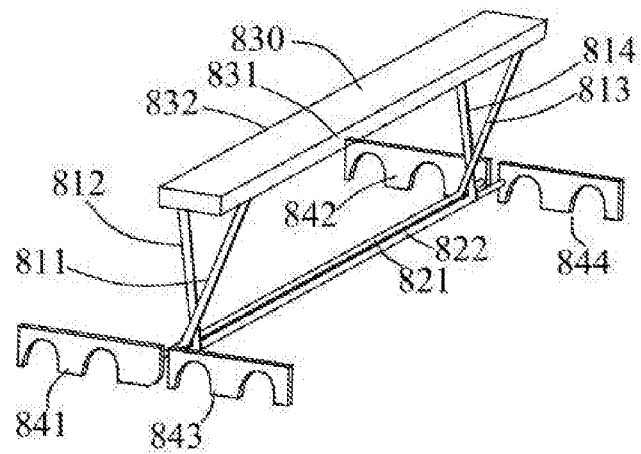
FIG. 9 is a schematic diagram of the lifting mechanism and the transmission mechanism according to the first embodiment of the present invention when the foldable display device is in the unfolded state, in which gears are omitted.
Figure 10:
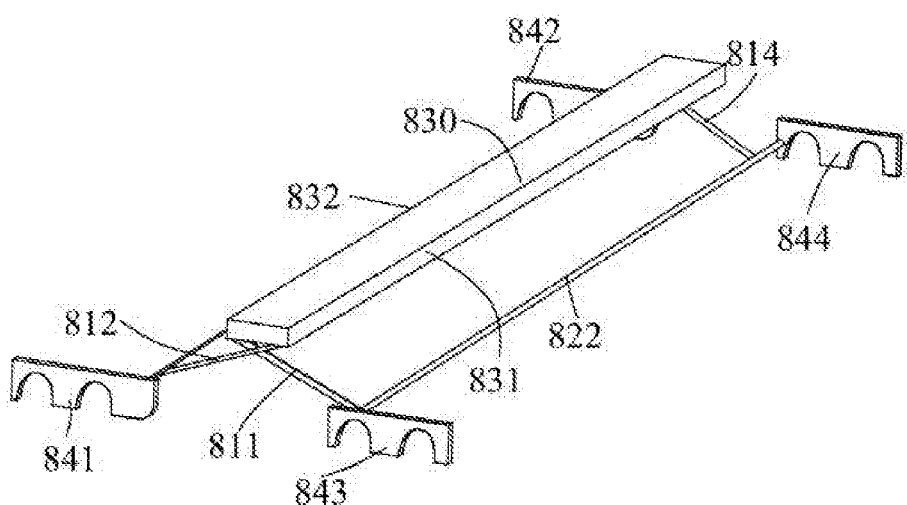
FIG. 10 is a schematic diagram of the lifting mechanism and the transmission mechanism according to the first embodiment of the present invention when the foldable display device is in the folded state, in which the gears are omitted.

The following description of various embodiments of the present disclosure with reference to the accompanying drawings is used to illustrate specific embodiments that can be practiced. Directional terms mentioned in the present disclosure, such as "above", "below", "front", "back", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structures are indicated by the same reference numerals.

Please refer to FIG. 1 to FIG. 10. A foldable display device 11 according to a first embodiment of the present invention comprises a flexible display panel 500, a first bottom shell 100, a second bottom shell 200, a lifting mechanism, and a transmission mechanism. The flexible display panel 500 may be an organic light emitting diode display panel. The flexible display panel 500 comprises a first display area 510, a second display area 520, and a foldable display area 530 between the first display area 510 and the second display area 520. The first display area 510, the second display area 520, and the foldable display area 530 are integrally formed and display a screen together. The foldable display area 530 is in a curved state when the foldable display device 11 is in a folded state and is in a flat state when the foldable display device 11 is in an unfolded state. The first bottom shell 100 is disposed below the first display area 510. The second bottom shell 200 is disposed below the second display area 520.

The lifting mechanism comprises a support member 830, a first support rod 811, a second support rod 812, a third support rod 813, and a fourth support rod 814. The support member 830 is disposed below the foldable display area 530. The support member 830 may be a rigid plate. Top ends of the first support rod 811 and the third support rod 813 are rotatably connected to a first side 831 of the support member 830, and top ends of the second support rod 812 and the fourth support rod 814 are rotatably connected to a second side 832 of the support member 830. The second side 832 is opposite to the first side 831. That is, the first support rod 811 and the second support rod 812 are disposed below a first side 531 of the foldable display area 530. The third support rod 813 and the fourth support rod 814 are disposed below a second side 532 of the foldable display area 530. The first support rod 811 intersects the second support rod 812. The third support rod 813 intersects the fourth support rod 814.

The transmission mechanism comprises a first bottom rod 821, a second bottom rod 822, a first rack 841, a second rack 842, a third rack 843, a fourth rack 844, a first gear 851, a second gear 852, a third gear 853, and a fourth gear 854. Both ends of the first bottom rod 821 are respectively connected to the bottom end of the first support rod 811 and the bottom end of the third support rod 813. Both ends of the second bottom rod 822 are respectively connected to the bottom end of the second support rod 812 and the bottom end of the fourth support rod 814. The second bottom rod 822 is parallel to the first bottom rod 821. The first rack 841 is connected to one end of the first bottom rod 821. The second rack 842 is connected to the other end of the first bottom rod 821. The third rack 843 is connected to one end of the second bottom rod 822. The fourth rack 844 is connected to the other end of the second bottom rod 822. The first gear 851 is connected to an end of a side of the second bottom shell 200 facing the first bottom shell 100. The first gear 851 is disposed on and meshes with the first rack 841. The second gear 852 is connected to the other end of a side of the second bottom shell 200 facing the first bottom shell 100. The second gear 852 is disposed on and meshes with the second rack 842. The first gear 851 and the second gear 852 may be integrally formed with the second bottom shell 200. The third gear 853 is connected to an end of a side of the first bottom shell 100 facing the second bottom shell 200. The third gear 853 is disposed on the third rack 843 and meshes with the third rack 843 and the first gear 851. The fourth gear 854 is connected to the other end of a side of the first bottom shell 100 facing the second bottom shell 200. The fourth gear 854 is disposed on the fourth rack 844 and meshes with the fourth rack 844 and the second gear 852. The third gear 853 and the fourth gear 854 may be integrally formed with the first bottom shell 100.

During the unfolding process of the foldable display device 11, the first gear 851 and the third gear 853 rotate synchronously to bring the first rack 841 and the third rack 843 approach each other, and the second gear 852 and the fourth gear 854 rotate synchronously to bring the second rack 842 and the fourth rack 844 approach each other so that the first bottom rod 821 and the second bottom rod 822 approach each other, the bottom end of the first support rod 811 and the bottom end of the second support rod 812 approach each other, the bottom end of the third support rod 813 and the bottom of the fourth support rod 814 approach each other, and the support member 830 is raised in parallel with respect to the first bottom shell 100 and the second bottom shell 200 to a position providing support for the foldable display area 530. That is, the transmission mechanism can apply a moment to the first support rod 811, the second support rod 812, the third support rod 813, and the fourth support rod 814 during a unfolding process of the foldable display device 11 so that the bottom end of the first support rod 811 approach the bottom end of the second support rod 812, and the bottom end of the third support rod 813 approach the bottom of the fourth support rod 814. Therefore, the support member 830 provides support for the foldable display area 530 when the foldable display device 11 is in an unfolded state.

During a folding process of the foldable display device 11, the first gear 851 and the third gear 853 rotate synchronously to bring the first rack 841 and the third rack 843 away from each other, and the second gear 852 and the fourth gear 854 rotate synchronously to bring the second rack 842 and the fourth rack 844 away from each other, so that the first bottom rod 821 and the second bottom rod 822 away from each other, the bottom end of the first support rod 811 and the bottom end of the second support rod 812 away from each other, the bottom end of the third support rod 813 and the bottom of the fourth support rod 814 away from each other, and the support member 830 descends in parallel with respect to the first bottom shell 100 and the second bottom shell 200

During the processes of unfolding and folding the foldable display device 11, the transmission mechanism can convert a relative rotation of the first gear 851 and the third gear 853 into a linear movement of the first rack 841 and the third rack 843, and convert a relative rotation of the second gear 852 and the fourth gear 854 into a linear movement of the second rack 842 and the fourth rack 844.

In the first embodiment, the foldable display device 11 may further comprise a gear cover 900. The gear cover 900 comprises a cover plate 910, two side plates 920, and two sliding grooves 930. The cover plate 910 covers the lifting mechanism. The two side plates 920 are respectively disposed on two opposite sides of the cover plate 910. The first gear 851 and the third gear 853 are rotatably connected to one side plate 920. The second gear 852 and the fourth gear 854 are rotatably connected to the other side plate 920. Each of centers of the first gear 851, the second gear 852, the third gear 853, and the fourth gear 854 may be provided with a first threaded hole 175. The two side plates 920 may be provided with a plurality of second threaded holes 185 at positions corresponding to the first gear 851, the second gear 852, the third gear 853, and the fourth gear 854. A bolt 197 is passed through each first threaded hole 175 and its corresponding second threaded hole 185 and combined with a nut 198. Thereby, the first gear 851 and the third gear 853 are rotatably connected to one of the side plates 920, and the second gear 852 and the fourth gear 854 are rotatably connected to the other side plate 920. The two sliding grooves 930 are respectively disposed on the cover plate 910 near the two side plates 920. One of sliding grooves 930 is configured for the first rack 841 and the third rack 843 to slide linearly therein, and the other sliding groove 920 is configured for the second rack 842 and the fourth rack 844 to slide linearly therein.

In the first embodiment, the foldable display device 11 further comprises a first middle frame 300 and a second middle frame 400. The first middle frame 300 is disposed between the first bottom shell 100 and the first display area 510. The first middle frame 300 is configured to support the first display area 510 when the foldable display device 11 is in the unfolded state. The second middle frame 400 is disposed between the second bottom shell 200 and the second display area 520. The second middle frame 400 is configured to support the second display area 520 when the foldable display device 11 is in the unfolded state. When the foldable display device 11 is in the unfolded state, the transmission mechanism raises the support member 830 to a position where it can support the entire display panel 500 together with the first middle frames 300 and the second middle frame 400.

In the first embodiment, the foldable display device 11 further comprises a first front frame 600 and a second front frame 700. The first front frame 600 is disposed on the first display area 510 and surrounding the first bottom shell 100. The second front frame 700 disposed on the second display area 520 and surrounding the second bottom shell 200.

Figure 11:
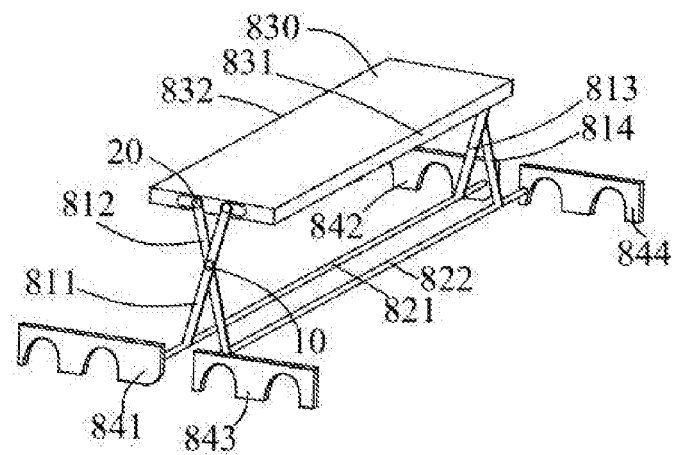
FIG. 11 is a schematic diagram of a lifting mechanism and a transmission mechanism according to a second embodiment of the present invention when a foldable display device is in an unfolded state, in which gears are omitted.
Figure 12:
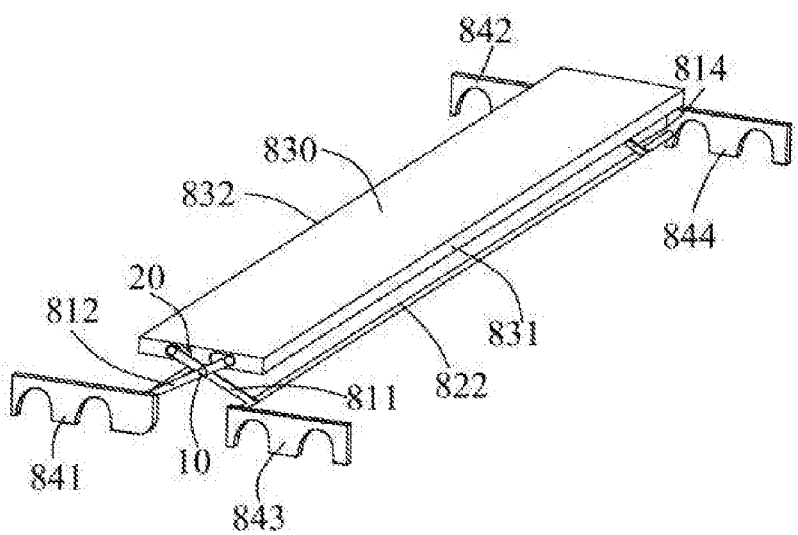
FIG. 12 is a schematic diagram of the lifting mechanism and the transmission mechanism according to the second embodiment of the present invention when the foldable display device is in a folded state, in which the gears are omitted.

Please refer to FIG. 11 and FIG. 12. A foldable display device of a second embodiment of the present invention is different from the foldable display device 11 of the first embodiment of the present invention in that: (1) an intersection of the first support rod 811 and the second support rod 812 is provided with a hinge 10, and an intersection of the third support rod 813 and the fourth support rod 814 is provided with another hinge 10, and (2) each of portions of the support member 830 rotatably connected to the top ends of the first support rod 811, the second support rod 812, the third support rod 813, and the fourth support rod 814 is provided with a chute 20.

The foldable display device of the second embodiment of the present invention has the same transmission mechanism as the first embodiment of the present invention. During the unfolding process of the foldable display device 11, the first gear 851 and the third gear 853 rotate synchronously to bring the first rack 841 and the third rack 843 approach each other via the corresponding chutes 20, and the second gear 852 and the fourth gear 854 rotate synchronously to bring the second rack 842 and the fourth rack 844 approach each other via the corresponding chutes 20, so that the first bottom rod 821 and the second bottom rod 822 approach each other, the top end of the first support rod 811 and the top end of the second support rod 812 approach each other via the corresponding chutes 20, the top end of the third support rod 813 and the top of the fourth support rod 814 approach each other via the corresponding chutes 20, and the support member 830 is raised in parallel with respect to the first bottom shell 100 and the second bottom shell 200 to a position providing support for the foldable display area 530. During a folding process of the foldable display device 11, the first gear 851 and the third gear 853 rotate synchronously to bring the first rack 841 and the third rack 843 away from each other, and the second gear 852 and the fourth gear 854 rotate synchronously to bring the second rack 842 and the fourth rack 844 away from each other, so that the first bottom rod 821 and the second bottom rod 822 away from each other, the top end of the first support rod 811 and the top end of the second support rod 812 away from each other via the corresponding chutes 20, the top end of the third support rod 813 and the top of the fourth support rod 814 away from each other via the corresponding chutes 20, and the support member 830 descends in parallel with respect to the first bottom shell 100 and the second bottom shell 200

According to the principle of leverage, a ratio of a distance from the top end of the first support rod to the adjacent hinge to a distance from the bottom end of the first support rod to the same hinge, a ratio of a distance from the top end of the second support rod to the adjacent hinge to a distance from the bottom end of the second support rod to the same hinge, a ratio of a distance from the top end of the third support rod to the adjacent hinge to a distance from the bottom end of the third support rod to the same hinge, and a ratio of a distance from the top end of the fourth support rod to the adjacent hinge to a distance from the bottom end of the fourth support rod to the same hinge are set to greater than 0 and less than or equal to 1. Thereby, lifting and lowering of the support 830 is more labor-saving.

Figure 13:
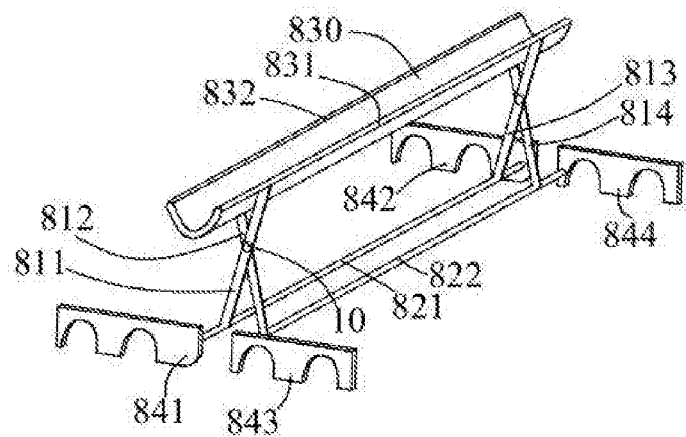
FIG. 13 is a schematic diagram of a lifting mechanism and a transmission mechanism according to a third embodiment of the present invention when a foldable display device is in a folded state, in which gears are omitted.
Figure 14:
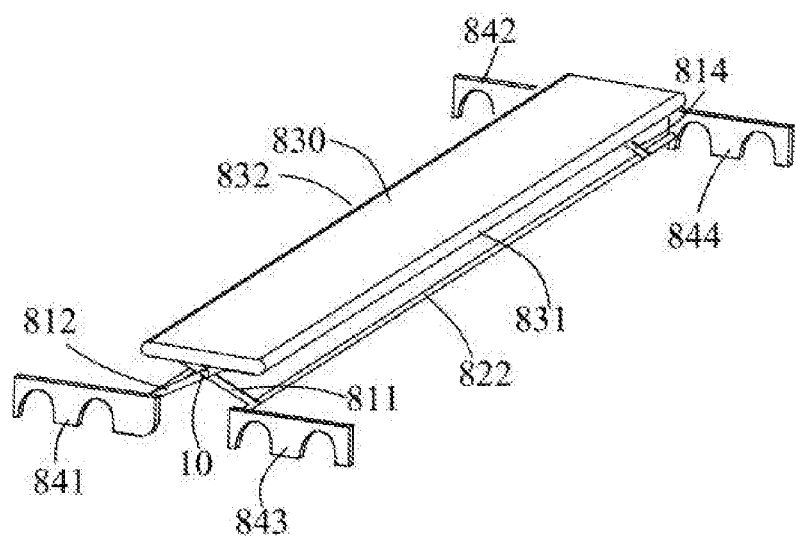
FIG. 14 is a schematic diagram of the lifting mechanism and the transmission mechanism according to the third embodiment of the present invention when the foldable display device is in an unfolded state, in which the gears are omitted.

Please refer to FIG. 13 and FIG. 14. A foldable display device of a third embodiment of the present invention is different from the foldable display device 11 of the first embodiment of the present invention in that: (1) an intersection of the first support rod 811 and the second support rod 812 is provided with a hinge 10, and an intersection of the third support rod 813 and the fourth support rod 814 is provided with another hinge 10, (2) the support member 830 is a flexible plate made of a flexible material or a plurality of rigid strips connected together by a rotating shaft, and (3) in the transmission mechanism, the first gear 851 is disposed below and meshes with the first rack 841, the second gear 852 is disposed below and meshes with the second rack 842, the third gear 853 is disposed below the third rack 843 and meshes with the third rack 843 and the first gear 851, and the fourth gear 854 is disposed below the fourth rack 844 and meshes with the fourth rack 844 and the second gear 852.

During a unfolding process of the foldable display device, the first gear 851 and the third gear 853 rotate synchronously to bring the first rack 841 and the third rack 843 away from each other, and the second gear 852 and the fourth gear 854 rotate synchronously to bring the second rack 842 and the fourth rack 844 away from each other so that the first bottom rod 821 and the second bottom rod 822 away from each other, the top end of the first support rod 811 and the top end of the second support rod 812 away from each other, and the top end of the third support rod 813 and the top of the fourth support rod 814 away from each other. When the foldable display device is in an unfolded state, the support member 830 is in an unfolded state and provides support for the foldable display area 530.

During a folding process of the foldable display device, the first gear 851 and the third gear 853 rotate synchronously to bring the first rack 841 and the third rack 843 approach each other, and the second gear 852 and the fourth gear 854 rotate synchronously to bring the second rack 842 and the fourth rack 844 approach each other so that the first bottom rod 821 and the second bottom rod 822 approach each other, the top end of the first support rod 811 and the top end of the second support rod 812 approach each other, and the top end of the third support rod 813 and the top of the fourth support rod 814 approach each other. When the foldable display device is in a folded state, the support plate 830 is bent and accommodated in a space defined by the first support rod 811, the second support rod 812, the third support rod 813, and the fourth support rod 814 from their top ends to their adjacent intersections. Furthermore, the foldable display area 530 may be bent and accommodated in the bent support member 830.

According to the principle of leverage, a ratio of a distance from the top end of the first support rod to the adjacent hinge to a distance from the bottom end of the first support rod to the same hinge, a ratio of a distance from the top end of the second support rod to the adjacent hinge to a distance from the bottom end of the second support rod to the same hinge, a ratio of a distance from the top end of the third support rod to the adjacent hinge to a distance from the bottom end of the third support rod to the same hinge, and a ratio of a distance from the top end of the fourth support rod to the adjacent hinge to a distance from the bottom end of the fourth support rod to the same hinge are set to greater than 0 and less than or equal to 1. Thereby, lifting and lowering of the support 830 is more labor-saving.

When a foldable display device of the present invention is in an unfolded state, a support member of a lifting mechanism provides support for a foldable display area by a transmission mechanism. This prevents the foldable display area from collapsing due to finger pressing, or wrinkling and peeling due to bending. In the above, the present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. A foldable display device, comprising:
    a flexible display panel comprising a first display area, a second display area, and a foldable display area between the first display area and the second display area;
    a first bottom shell disposed below the first display area;
    a second bottom shell disposed below the second display area;
    a lifting mechanism comprising a support member, a first support rod, a second support rod, a third support rod, and a fourth support rod, wherein the support member is disposed below the foldable display area, top ends of the first support rod and the third support rod are rotatably connected to a first side of the support member, top ends of the second support rod and the fourth support rod are rotatably connected to a second side of the support member, the second side is opposite to the first side, the first support rod intersects the second support rod, and the third support rod intersects the fourth support rod; and a transmission mechanism connected to bottom ends of the first support rod, the second support rod, the third support rod, and the fourth support rod, the first bottom shell, and the second bottom shell, wherein the transmission mechanism is configured to apply a moment to the first support rod, the second support rod, the third support rod, and the fourth support rod during a unfolding process of the foldable display device so that the support member provides support for the foldable display area when the foldable display device is in an unfolded state.

2. The foldable display device according to claim 1, wherein the support member is a rigid plate; and during the process of unfolding the foldable display device, the transmission mechanism makes the bottom end of the first support rod close to the bottom end of the second support rod, and makes the bottom end of the third support rod close to the bottom end of the fourth support rod, so that the support member is raised in parallel with respect to the first bottom shell and the second bottom shell to a position providing support for the foldable display area.

3. The foldable display device according to claim 2, wherein the transmission mechanism comprises:
   a first bottom rod, both ends of which are respectively connected to the bottom end of the first support rod and the bottom end of the third support rod;
   a second bottom rod, both ends of which respectively connected to the bottom end of the second support rod and the bottom end of the fourth support rod, wherein the second bottom rod is parallel to the first bottom rod;
   a first rack connected to one end of the first bottom rod;
   a second rack connected to the other end of the first bottom rod;
   a third rack connected to one end of the second bottom rod;
   a fourth rack connected to the other end of the second bottom rod;
   a first gear connected to an end of a side of the second bottom shell facing the first bottom shell, wherein the first gear is disposed on and meshes with the first rack;
   a second gear connected to the other end of a side of the second bottom shell facing the first bottom shell, wherein the second gear is disposed on and meshes with the second rack;
   a third gear connected to an end of a side of the first bottom shell facing the second bottom shell, wherein the third gear is disposed on the third rack and meshes with the third rack and the first gear; and
   a fourth gear connected to the other end of a side of the second bottom shell facing the first bottom shell, wherein the fourth gear is disposed on the fourth rack and meshes with the fourth rack and the second gear.

4. The foldable display device according to claim 3, wherein during the unfolding process of the foldable display device, the first gear and the third gear rotate synchronously to bring the first rack and the third rack approach each other, and the second gear and the fourth gear rotate synchronously to bring the second rack and the fourth rack approach each other; so that the first bottom rod and the second bottom rod approach each other, the bottom end of the first support rod and the bottom end of the second support rod approach each other, the bottom end of the third support rod and the bottom of the fourth support rod approach each other, and the support member is raised in parallel with respect to the first bottom shell and the second bottom shell to a position providing support for the foldable display area.

5. The foldable display device according to claim 4, further comprising a gear cover, wherein the gear cover comprises:
   a cover plate covering the lifting mechanism;
   two side plates respectively disposed on two opposite sides of the cover plate, wherein the first gear and the third gear are rotatably connected to one side plate, and the second gear and the fourth gear are rotatably connected to the other side plate; and
   two sliding grooves respectively disposed on the cover plate near the two side plates, wherein one of which is configured for the first rack and the third rack to slide therein, and the other is configured for the second rack and the fourth rack to slide therein.

6. The foldable display device according to claim 1, further comprising:
   a first middle frame disposed between the first bottom shell and the first display area and configured to support the first display area when the foldable display device is in the unfolded state; and
   a second middle frame disposed between the second bottom shell and the second display area and configured to support the second display area when the foldable display device is in the unfolded state.

7. The foldable display device according to claim 1, further comprising:
   a first front frame disposed on the first display area and surrounding the first bottom shell; and
   a second front frame disposed on the second display area and surrounding the second bottom shell.

8. The foldable display device according to claim 1, wherein
   an intersection of the first support rod and the second support rod is provided with a hinge, and an intersection of the third support rod and the fourth support rod is provided with another hinge;
   the support member is a rigid plate provided with four chutes, and the top ends of the first support rod, the second support rod, the third support rod, and the fourth support rod are rotatably connected to the support member via the four chutes, respectively; and
   during the unfolding process of the foldable display device, the transmission mechanism makes the top ends of the first support rod and the second support rod approach each other through the chutes and makes the top ends of the third support rod and the fourth support rod approach each other through the chutes so that the support member is raised in parallel with respect to the first bottom shell and the second bottom shell to a position providing support for the foldable display area.

9. The foldable display device according to claim 8, wherein a ratio of a distance from the top end of the first support rod to the adjacent hinge to a distance from the bottom end of the first support rod to the same hinge, a ratio of a distance from the top end of the second support rod to the adjacent hinge to a distance from the bottom end of the second support rod to the same hinge, a ratio of a distance from the top end of the third support rod to the adjacent hinge to a distance from the bottom end of the third support rod to the same hinge, and a ratio of a distance from the top end of the fourth support rod to the adjacent hinge to a distance from the bottom end of the fourth support rod to the same hinge are greater than 0 and less than or equal to 1.

10. The foldable display device according to claim 8, wherein the transmission mechanism comprises:
a first bottom rod, both ends of which are respectively connected to the bottom end of the first support rod and the bottom end of the third support rod;
a second bottom rod, both ends of which respectively connected to the bottom end of the second support rod and the bottom end of the fourth support rod, wherein the second bottom rod is parallel to the first bottom rod;
a first rack connected to one end of the first bottom rod;
a second rack connected to the other end of the first bottom rod;
a third rack connected to one end of the second bottom rod;
a fourth rack connected to the other end of the second bottom rod;
a first gear connected to an end of a side of the second bottom shell facing the first bottom shell, wherein the first gear is disposed on and meshes with the first rack;
a second gear connected to the other end of a side of the second bottom shell facing the first bottom shell, wherein the second gear is disposed on and meshes with the second rack;
a third gear connected to an end of a side of the first bottom shell facing the second bottom shell, wherein the third gear is disposed on the third rack and meshes with the third rack and the first gear; and
a fourth gear connected to the other end of a side of the second bottom shell facing the first bottom shell, wherein the fourth gear is disposed on the fourth rack and meshes with the fourth rack and the second gear.

11. The foldable display device according to claim 10, wherein during the unfolding process of the foldable display device, the first gear and the third gear rotate synchronously to bring the first rack and the third rack approach each other, and the second gear and the fourth gear rotate synchronously to bring the second rack and the fourth rack approach each other; so that the first bottom rod and the second bottom rod approach each other, the bottom end of the first support rod and the bottom end of the second support rod approach each other, the bottom end of the third support rod and the bottom of the fourth support rod approach each other, and the support member is raised in parallel with respect to the first bottom shell and the second bottom shell to a position providing support for the foldable display area.

12. The foldable display device according to claim 1, wherein
an intersection of the first support rod and the second support rod is provided with a hinge, and an intersection of the third support rod and the fourth support rod is provided with another hinge;
the support member is a flexible plate; and
during the unfolding process of the foldable display device, the transmission mechanism makes the top end of the first support rod away from the top end of the second support rod and makes the top end of the third support rod away from the top end of the fourth support rod, so that the support member is unfolded to provide support for the foldable display area.

13. The foldable display device according to claim 12, wherein a ratio of a distance from the top end of the first support rod to the adjacent hinge to a distance from the bottom end of the first support rod to the same hinge, a ratio of a distance from the top end of the second support rod to the adjacent hinge to a distance from the bottom end of the second support rod to the same hinge, a ratio of a distance from the top end of the third support rod to the adjacent hinge to a distance from the bottom end of the third support rod to the same hinge, and a ratio of a distance from the top end of the fourth support rod to the adjacent hinge to a distance from the bottom end of the fourth support rod to the same hinge are greater than 0 and less than or equal to 1.

14. The foldable display device according to claim 12, wherein the transmission mechanism comprises:
a first bottom rod, both ends of which are respectively connected to the bottom end of the first support rod and the bottom end of the third support rod;
a second bottom rod, both ends of which respectively connected to the bottom end of the second support rod and the bottom end of the fourth support rod, wherein the second bottom rod is parallel to the first bottom rod;
a first rack connected to one end of the first bottom rod;
a second rack connected to the other end of the first bottom rod;
a third rack connected to one end of the second bottom rod;
a fourth rack connected to the other end of the second bottom rod;
a first gear connected to an end of a side of the second bottom shell facing the first bottom shell, wherein the first gear is disposed below and meshes with the first rack;
a second gear connected to the other end of a side of the second bottom shell facing the first bottom shell, wherein the second gear is disposed below and meshes with the second rack;
a third gear connected to an end of a side of the first bottom shell facing the second bottom shell, wherein the third gear is disposed below the third rack and meshes with the third rack and the first gear; and
a fourth gear connected to the other end of a side of the second bottom shell facing the first bottom shell, wherein the fourth gear is disposed below the fourth rack and meshes with the fourth rack and the second gear.

15. The foldable display device according to claim 14, wherein during the unfolding process of the foldable display device, the first gear and the third gear rotate synchronously to bring the first rack and the third rack away from each other, and the second gear and the fourth gear rotate synchronously to bring the second rack and the fourth rack away from each other; so that the first bottom rod and the second bottom rod each other, the bottom end of the first support rod and the bottom end of the second support rod away from each other, the bottom end of the third support rod and the bottom of the fourth support rod away from each other, so that the support member is unfolded to provide support for the foldable display area.

16. The foldable display device according to claim 12, wherein
when the foldable display device is in a folded state, the flexible plate is bent and accommodated in a space defined by the first support rod, the second support rod, the third support rod, and the fourth support rod from their top ends to their adjacent intersections; and
when the foldable display device is in an unfolded state, the flexible plate is in an unfolded state.

17. The foldable display device according to claim 16, wherein the flexible plate is made of a flexible material or a plurality of rigid strips connected together by a rotating shaft.

* * * * *